(12) United States Patent
Kim et al.

(10) Patent No.: US 12,274,079 B2
(45) Date of Patent: Apr. 8, 2025

(54) DEEP TRENCH CAPACITORS EMBEDDED IN PACKAGE SUBSTRATE

(71) Applicant: Google LLC, Mountain View, CA (US)

(72) Inventors: Nam Hoon Kim, San Jose, CA (US); Teckgyu Kang, Saratoga, CA (US); Scott Lee Kirkman, Menlo Park, CA (US); Woon-Seong Kwon, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/244,716

(22) Filed: Sep. 11, 2023

(65) Prior Publication Data

US 2023/0420494 A1    Dec. 28, 2023

Related U.S. Application Data

(62) Division of application No. 16/806,791, filed on Mar. 2, 2020, now Pat. No. 11,784,215.

(51) Int. Cl.
*H01L 21/48* (2006.01)
*H01L 23/00* (2006.01)
(Continued)

(52) U.S. Cl.
CPC ........... *H10D 1/716* (2025.01); *H01L 21/486* (2013.01); *H01L 23/13* (2013.01);
(Continued)

(58) Field of Classification Search
None
See application file for complete search history.

(56) References Cited

U.S. PATENT DOCUMENTS

| 6,774,008 B1 | 8/2004 | Su et al. |
| 6,894,385 B1 | 5/2005 | Jafari et al. |

(Continued)

FOREIGN PATENT DOCUMENTS

| CN | 108232495 | 6/2018 |
| WO | WO 2019/132926 | 7/2019 |

OTHER PUBLICATIONS

Elisabeth et al., "TSMC Deep Trench Capacitor Land-Side Decoupling Capacitor in Apple's A10 Application Processor", System Plus Consulting, Oct. 2016, 5 pages.

(Continued)

*Primary Examiner* — Hung K Vu
(74) *Attorney, Agent, or Firm* — Fish & Richardson P.C.

(57) ABSTRACT

This disclosure relates to deep trench capacitors embedded in a package substrate on which an integrated circuit is mounted. In some aspects, a chip package includes an integrated circuit die that has a power distribution circuit for one or more circuits of the integrated circuit. The chip package also includes a substrate different from the integrated circuit and having a first surface on which the integrated circuit die is mounted and a second surface opposite the first surface. The substrate includes one or more cavities formed in at least one of the first surface or the second surface. The chip package also includes one or more deep trench capacitors disposed in at least one of the one or more cavities. Each deep trench capacitor is connected to the power distribution circuit by conductors.

23 Claims, 6 Drawing Sheets

(51) Int. Cl.
  *H01L 23/13* (2006.01)
  *H01L 23/498* (2006.01)
  *H01L 25/16* (2023.01)
  *H10D 1/68* (2025.01)

(52) U.S. Cl.
  CPC .. *H01L 23/49816* (2013.01); *H01L 23/49827* (2013.01); *H01L 23/49838* (2013.01); *H01L 24/16* (2013.01); *H01L 24/81* (2013.01); *H01L 25/16* (2013.01); H01L 2224/16225 (2013.01); H01L 2924/1433 (2013.01); H01L 2924/19041 (2013.01); H01L 2924/19102 (2013.01)

(56) References Cited

U.S. PATENT DOCUMENTS

| | | | |
|---|---|---|---|
| 7,030,481 | B2 | 4/2006 | Chudzik et al. |
| 7,439,128 | B2 | 10/2008 | Divakaruni et al. |
| 7,923,815 | B2 | 4/2011 | Wang et al. |
| 8,361,875 | B2 | 1/2013 | Zhu |
| 9,178,080 | B2 | 11/2015 | Kalnitsky et al. |
| 10,510,722 | B2 | 12/2019 | Chen et al. |
| 2003/0015783 | A1 | 1/2003 | Schaper |
| 2004/0108587 | A1* | 6/2004 | Chudzik ................ H01L 23/50 |
| | | | 257/E23.079 |
| 2004/0203206 | A1 | 10/2004 | Rotem |
| 2008/0142961 | A1* | 6/2008 | Jones ................ H01L 25/165 |
| | | | 257/E23.085 |
| 2009/0085217 | A1 | 4/2009 | Knickerbocker et al. |
| 2014/0145300 | A1 | 5/2014 | Bhagavat et al. |
| 2014/0159197 | A1 | 6/2014 | Weng et al. |
| 2014/0246773 | A1* | 9/2014 | Kent ................ H01L 23/293 |
| | | | 257/738 |
| 2015/0102395 | A1 | 4/2015 | Park et al. |
| 2016/0020267 | A1* | 1/2016 | Lin ................ H01L 29/945 |
| | | | 257/532 |
| 2017/0207196 | A1* | 7/2017 | Lee ................ H01L 25/0657 |
| 2019/0131273 | A1 | 5/2019 | Chen et al. |
| 2019/0164905 | A1 | 5/2019 | Hsieh et al. |
| 2020/0204067 | A1 | 6/2020 | Dabral et al. |

OTHER PUBLICATIONS

Extended European Search Report in European Appln. No. 20210624.1, mailed on Jul. 16, 2021, 10 pages.
Office Action in European Appln. No. 20210624.1, mailed on Feb. 16, 2024, 9 pages.
Notice of Allowance in Taiwan Appln. No. 109142014, mailed on Jul. 31, 2024, 12 pages (with English Machine Translation).
Office Action in Chinese Appln. No. 202011371069.7, mailed on Aug. 26, 2024, 21 pages (with English translation).
Notice of Allowance in Chinese Appln. No. 202011371069.7, mailed on Feb. 8, 2025, 7 pages (with English translation).

* cited by examiner

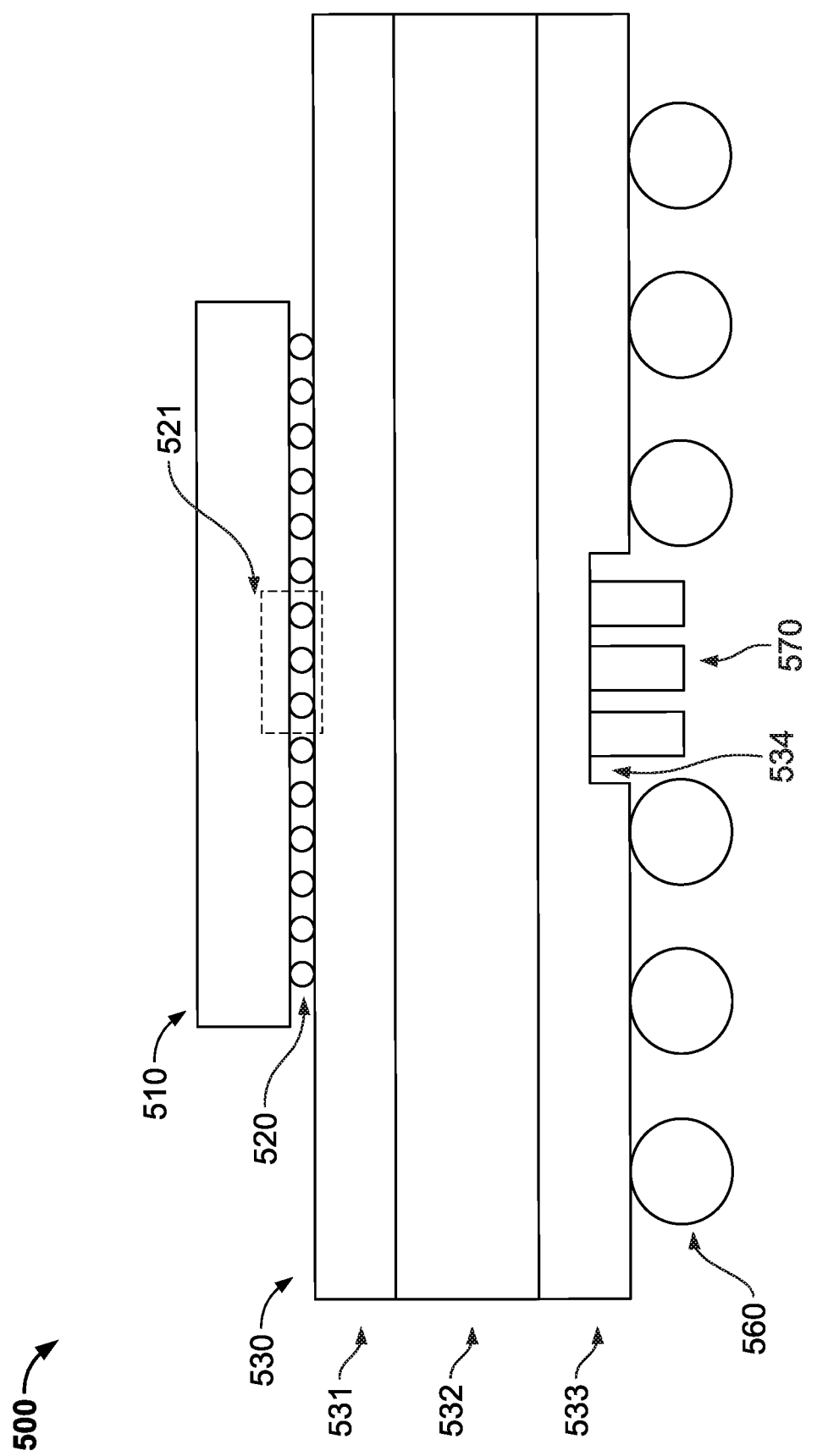

DEEP TRENCH CAPACITORS EMBEDDED IN PACKAGE SUBSTRATE

CROSS-REFERENCE TO RELATED APPLICATIONS

This application is a divisional application of and claims the benefit of priority to U.S. application Ser. No. 16/806,791, filed on Mar. 2, 2020, the contents of which are hereby incorporated by reference.

BACKGROUND

Dynamic noise (di/dt) for processor cores and application-specific integrated circuits (ASICs) is becoming more problematic due to faster core clock frequencies and higher current consumption of the circuits. The di/dt represents the rate of change of the current by the load, e.g., the core of the ASIC. Faster core clock frequencies result in more transient current flow and therefore more noise. In addition, higher di/dt noise results in higher voltage loss of the power supplied to the circuit.

SUMMARY

This specification describes technologies relating to deep trench capacitors embedded in the package substrate on which an integrated circuit is mounted.

In general, one innovative aspect of the subject matter described in this specification can be embodied in chip packages that include an integrated circuit die including a power distribution circuit for one or more circuits of the integrated circuit; a substrate different from the integrated circuit and having (i) a first surface on which the integrated circuit die is mounted and (ii) a second surface opposite the first surface, the substrate including one or more cavities formed in at least one of the first surface or the second surface; and one or more deep trench capacitors disposed in at least one of the one or more cavities, each deep trench capacitor being connected to the power distribution circuit by conductors.

These and other implementations can each optionally include one or more of the following features. In some aspects, each cavity is formed on the first surface and extends from the first surface into the substrate.

In some aspects, each cavity is formed on the second surface and extends from the second surface into the substrate. In some aspects, each cavity and each deep trench capacitor is arranged under the power distribution circuit. In some aspects, the substrate includes, for each conductor a via in which the conductor is routed from the deep trench capacitor through the substrate and to a contact of the integrated circuit die. In some aspects, the one or more cavities include multiple cavities and the substrate includes substrate walls between adjacent cavities.

In some aspects, each cavity is formed on the second surface and extends from the second surface into the substrate. The second surface can include a ball grid array with multiple interconnection pads that each extend from the second surface to an end of the interconnection pad. Each deep trench capacitor can extend out of the cavity without extending past the ends of the interconnection pads.

In general, another aspect of the subject matter described in this specification can be embodied in methods for fabricating chip packages. The methods include forming one or more cavities in a substrate having (i) a first surface configured to receive an integrated circuit die and (ii) a second surface opposite the first surface, each cavity being formed in at least one of the first surface or the second surface; mounting one or more deep trench capacitors in each cavity; and mounting the integrated circuit die on the first surface.

These and other implementations can each optionally include one or more of the following features. In some aspects, each cavity is formed in the first surface. Forming the one or more cavities includes applying one or more layers of substrate build-up to the first surface after mounting the one or more deep trench capacitors in each cavity.

In some aspects, each deep trench capacitor is electrically connected to the integrated circuit by way of vias formed in the substrate. In some aspects, forming the one or more cavities includes etching away a portion of the substrate.

In some aspects, each cavity is formed in the first surface, the deep trench capacitor is connected to the integrated circuit die prior to mounting the integrated circuit on the first surface mounting the integrated circuit die on the first surface and mounting the one or more deep trench capacitors in each cavity includes mounting the integrated circuit die such that each deep trench capacitors are disposed within a cavity.

In some aspects, forming the one or more cavities includes applying a release layer to the first surface; applying one or more build-up layers over the release layer; and removing the release layer and each portion of each build-up layer that covers the release layer. Applying the release layer can include applying the release layer on a portion of the first surface where the cavity will be formed.

In general, another aspect of the subject matter described in this specification can be embodied in chip packages that include an integrated circuit die; a substrate having (i) a first surface on which the integrated circuit die is mounted and (ii) a second surface opposite the first surface, the substrate including one or more cavities formed in at least one of the first surface or the second surface; and one or more capacitors disposed in at least one of the one or more cavities and being connected to the integrated circuit die.

These and other implementations can each optionally include one or more of the following features. In some aspects, the one or more capacitors include deep trench capacitors. In some aspects, the one or more capacitors decouple one or more circuits of the integrated circuit die from a power circuit of the integrated circuit die.

In some aspects, each cavity is formed on the first surface and extends from the first surface into the substrate. In some aspects, each cavity is formed on the second surface and extends from the second surface into the substrate. In some aspects, each cavity and each deep trench capacitor is arranged under the power distribution circuit.

The subject matter described in this specification can be implemented in particular embodiments so as to realize one or more of the following advantages. By embedding deep trench capacitors in the substrate of a chip package rather than on the integrated circuit die, the amount of decoupling capacitance can be increased without increasing the size of the die. This enables a greater reduction of dynamic noise (di/dt) and a greater reduction in voltage drop caused by the noise without increasing the size of the die. The deep trench capacitors can be embedded on the side of the substrate to which the die is mounted or the opposite side, giving flexibility based on the load variation frequency causing the noise. For example, deep trench capacitors that are embedded closer to the die can be smaller with lower capacitances to address higher frequency noise as the conductors between the capacitors and the die are shorter resulting in less added inductance relative to further away capacitors. Embedding deep trench capacitors on the opposite side of the substrate can allow for larger capacitors with higher capacitance to address lower frequency noise as the higher capacitance and higher inductance results in a lower resonant frequency.

Various features and advantages of the foregoing subject matter is described below with respect to the figures. Additional features and advantages are apparent from the subject matter described herein and the claims.

BRIEF DESCRIPTION OF THE DRAWINGS

FIG. 5 is a cross-sectional view of another example IC package that includes an IC and deep trench capacitors embedded in a substrate of the IC package.

Like reference numbers and designations in the various drawings indicate like elements.

DETAILED DESCRIPTION

In general, this document describes technologies relating to deep trench capacitors embedded in the package substrate on which an integrated circuit (IC) is mounted. The di/dt noise caused by higher core clock frequencies and higher current consumption of high performance ICs can be suppressed by adding decoupling capacitors to the chip package. However, as the real estate of a chip's die size is limited, there is a limited ability to keep adding decoupling capacitors to the die to offset additional noise produced by the faster clock frequencies and higher current consumption.

The chip packages described in this document include decoupling capacitors in the form of deep trench capacitors that are embedded in the package substrate to which the IC is mounted, rather than in the IC itself. For example, an IC can be mounted to one side of a substrate and the other side of the substrate can include a ball grid array (BGA) for connecting the package to a printed circuit board (PCB). The package substrate can include one or more cavities on one or both sides of the package substrate. The deep trench capacitors can be disposed in the cavities, e.g., and attached to either the substrate or to the die itself.

In general, a trench capacitor is a capacitor formed by etching one or more trenches in a substrate or wafer, forming an outer or buried plate electrode around and under the trench, forming a dielectric layer by covering the outer or buried plate electrode with a dielectric material, and forming an inner or upper electrode over the dielectric layer. A deep trench capacitor is a trench capacitor for which the aspect ratio (depth to width) of the trench meets or exceeds a threshold or the depth of the trench meets or exceeds a threshold. For example, the aspect ratio for a deep trench capacitor could be about five to ten, but could vary. The height of a deep trench capacitor can also vary, but the height is often about 64-80 micrometers (μm). Although the description that follows is largely in terms of deep trench capacitors, other types of capacitors can also be used.

Figure 1:
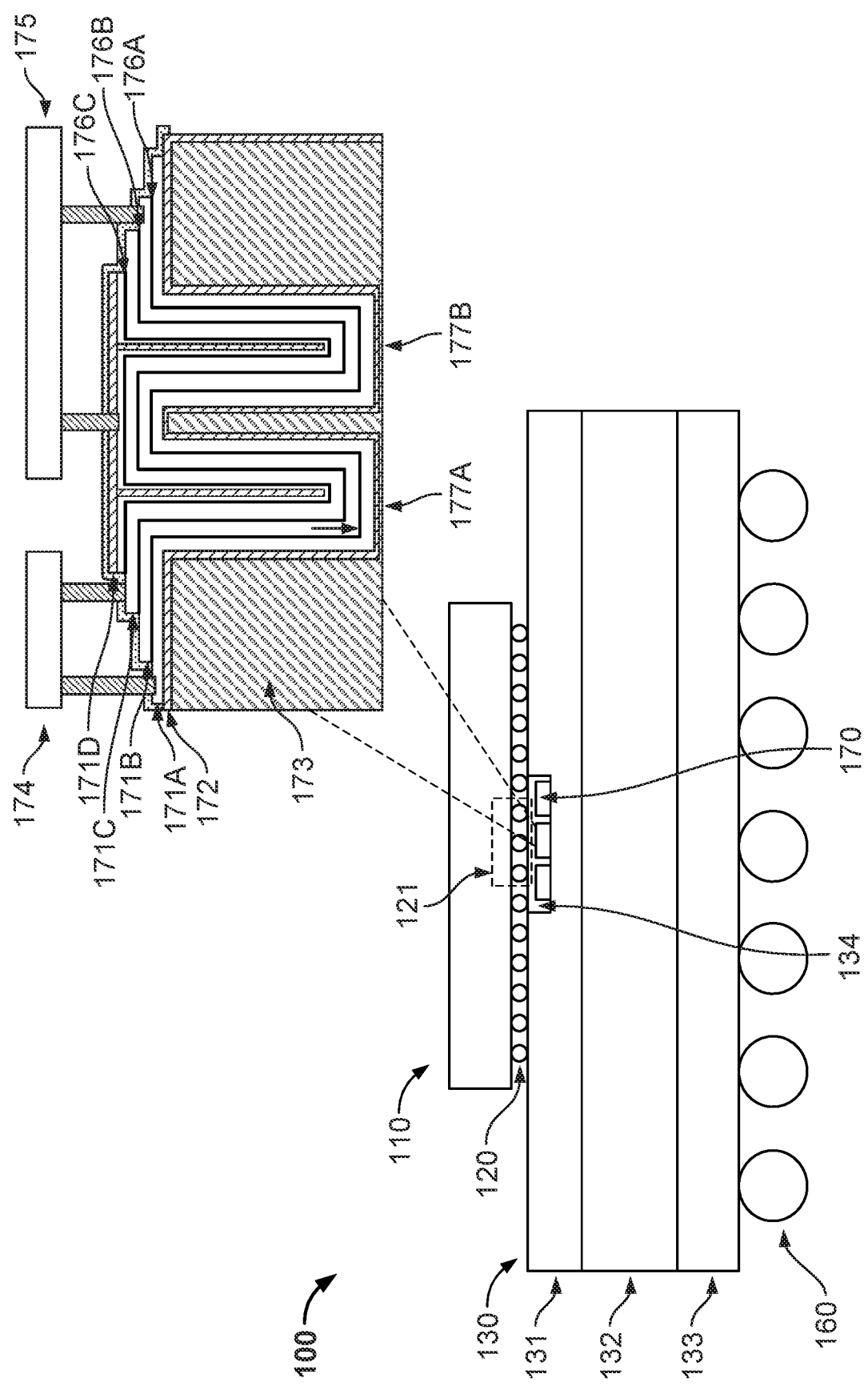
FIG. 1 is a cross-sectional view of an example integrated circuit (IC) package that includes an IC and deep trench capacitors embedded in a substrate of the IC package.

FIG. 1 is a cross-sectional view of an example IC package 100 that includes an IC 110 and deep trench capacitors 170 embedded in a substrate 130 of the IC package 100. The IC package 100 includes the substrate 130, the IC 110 mounted on the substrate 130, and a BGA ball 160 that includes interconnection pads with solder balls for connecting the IC package 100 to a PCB. The IC 110 can be an ASIC or other appropriate type of IC.

In this example, the IC package 100 is a flip chip package in which solder bumps 120 are used to connect interconnection pads of the IC 110 to the substrate 130. The solder bumps 120 include a contact area (e.g., pad) of the IC 110 and a solder ball that is used to connect the contact area to a corresponding contact area (e.g., pad) of the substrate 130. Although not shown in FIG. 1, the substrate 130 can include vias that connect the contact areas of the IC 110 to the interconnection pads of the BGA ball 160.

The substrate 130 includes a substrate core 132 and substrate build-up 131 and 133 on either side of the substrate core 132. One or both of the substrate build-ups 131 and 133 can be added to the substrate core 132, e.g., when fabricating the IC package 100. In some implementations, the substrate 130 includes only one or neither of the substrate build-ups 131 or 133. For example, the substrate 130 may only include a substrate build-up 131 or 133 on a side of the substrate core 132 that will include a cavity for deep trench capacitors.

The substrate 130 includes a cavity 134 for deep trench capacitors 170. In this example, the cavity 134 is formed in the substrate build-up 131 on a top side of the substrate 130. The cavity 134 can be formed by etching away some of the substrate build-up 131 or by adding a laminate substrate around the deep trench capacitors 170 after mounting the deep trench capacitors 170 on a surface of the substrate 130 (e.g., on a surface of the substrate core 132 or the substrate build-up 131). If etching is used, the deep trench capacitors 170 can be mounted in the cavity 134 after the cavity 134 is formed. The cavity 134 can also be formed using mechanical milling or buildup film removal after laser ablation. The deep trench capacitors 170 can be mounted in the cavity using, for example, pick and placement and/or flip chip assembly techniques.

An example deep trench capacitor 170 is illustrated in FIG. 1. However, many different types of deep trench capacitors can be used. In this example, the deep trench capacitor is a higher density silicon capacitor formed using a silicon wafer 173. The deep trench capacitor 170 includes two trenches 177A and 177B, although other deep trench capacitors can include a single trench or more than two trenches. The trenches 177A and 177B can be formed by etching away the silicon wafer 173.

The deep trench capacitor 170 includes an oxide liner 172 and four electrodes 171A-171D. The oxide liner 172 covers the walls and bottom of the trenches 177A and 177B. A first electrode 171A covers the oxide liner 172. A first dielectric 176A covers the first electrode 171A and a second electrode 171B covers the first dielectric 176A. That is, the first dielectric 176A is disposed between and separates the first and second electrodes 171A and 171B.

A second dielectric 176B covers the second electrode 171B and a third electrode 171C covers the second dielectric 176B such that the second dielectric 176B is disposed between and separates the second and third electrodes 171B and 171C. Similarly, a third dielectric 176C covers the third electrode 171C and a fourth electrode 171D covers the third dielectric 176C such that the third dielectric 176C is disposed between and separates the third and fourth electrodes 171C and 171D. The electrodes 171A-171D are made of a conductive material and the dielectrics 176A-176C are made of an insulating material.

The first electrode 171A and the third electrode 171C are both connected to a contact 174. Similarly, the second electrode 171B and the further electrode 171D are both connected to a contact 175. The contacts 174 and 175 of each deep trench capacitor 170 can be electrically connected to the IC 110. For example, the contacts 174 and 175 of each deep trench capacitor 170 can be connected to a core power distribution circuit of the IC 110.

Each contact 174 and 175 can be connected to the IC 110 using vias of the substrate 130 and the contact areas of the IC 110. The vias are conductive holes in the substrate 130. As these conductive holes can add inductance to the circuit to which the deep trench capacitor 170 is connected, the deep trench capacitors 170 can be arranged close to those circuits of the IC 110 to reduce the amount of added inductance. In this example, the deep trench capacitors 170 are located under a core power distribution circuit 121 of the IC 110 that distributes power to a core or other circuits of the IC 110. The deep trench capacitors 170 can be connected in the core power distribution circuit 121 in parallel with the core (or other circuits) of the IC 110 to decouple these circuits the core power distribution circuit 121 and reduce the di/dt noise imposed on the circuits.

To make the deep trench capacitors 170 more effective, the path to connect the deep trench capacitors 170 should be the least resistive/inductive of the possible paths. The closest proximity location with parallel via/trace/plane may be preferred for the capacitor mounting.

Figures 6, 7, 8:
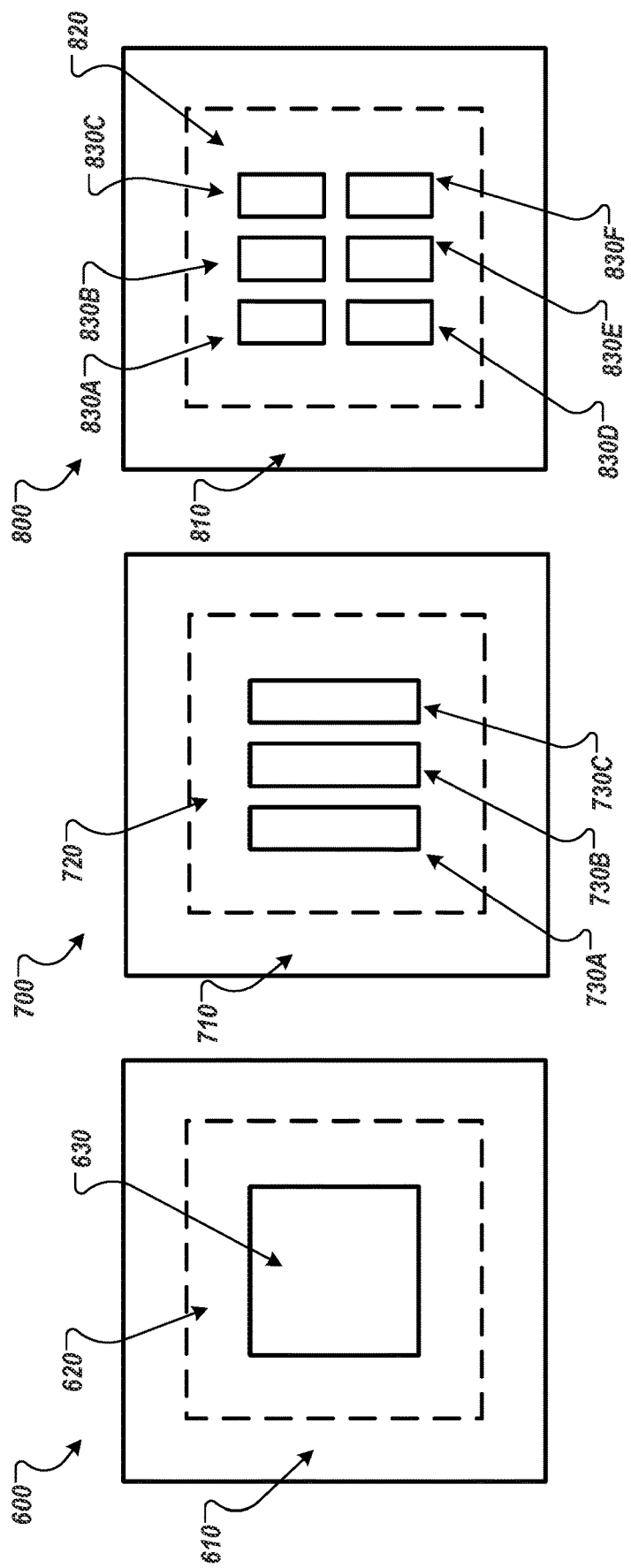
FIG. 6 is a diagram of an example arrangement of a cavity for deep trench capacitors.
FIG. 7 is a diagram of an example arrangement of cavities for deep trench capacitors.
FIG. 8 is a diagram of another example arrangement of cavities for deep trench capacitors.

The IC package 100 can include various quantities of deep trench capacitors 170. In this example, the IC package 100 includes a single cavity 134 that includes three deep trench capacitors 170. In other examples, the substrate 130 can include multiple cavities that each include one or more deep trench capacitors. Some example arrangements of substrate cavities are illustrated in FIGS. 6-8 and described below.

The number of deep trench capacitors 170, the size of the deep trench capacitors 170 (and therefore the size of the cavity 134), and the location of the deep trench capacitors 170 can be selected based on the IC 110 and its configuration or noise characteristics. These capacitors can be located on the bottom side of the substrate 130 (the side with substrate build-up 133) as it may have more room for larger deep trench capacitors than the top side of the substrate 130 (the side with build-up 131). For applications that have a higher noise frequency, the deep trench capacitors can be located on the top side closer to the IC 110.

Figure 2:
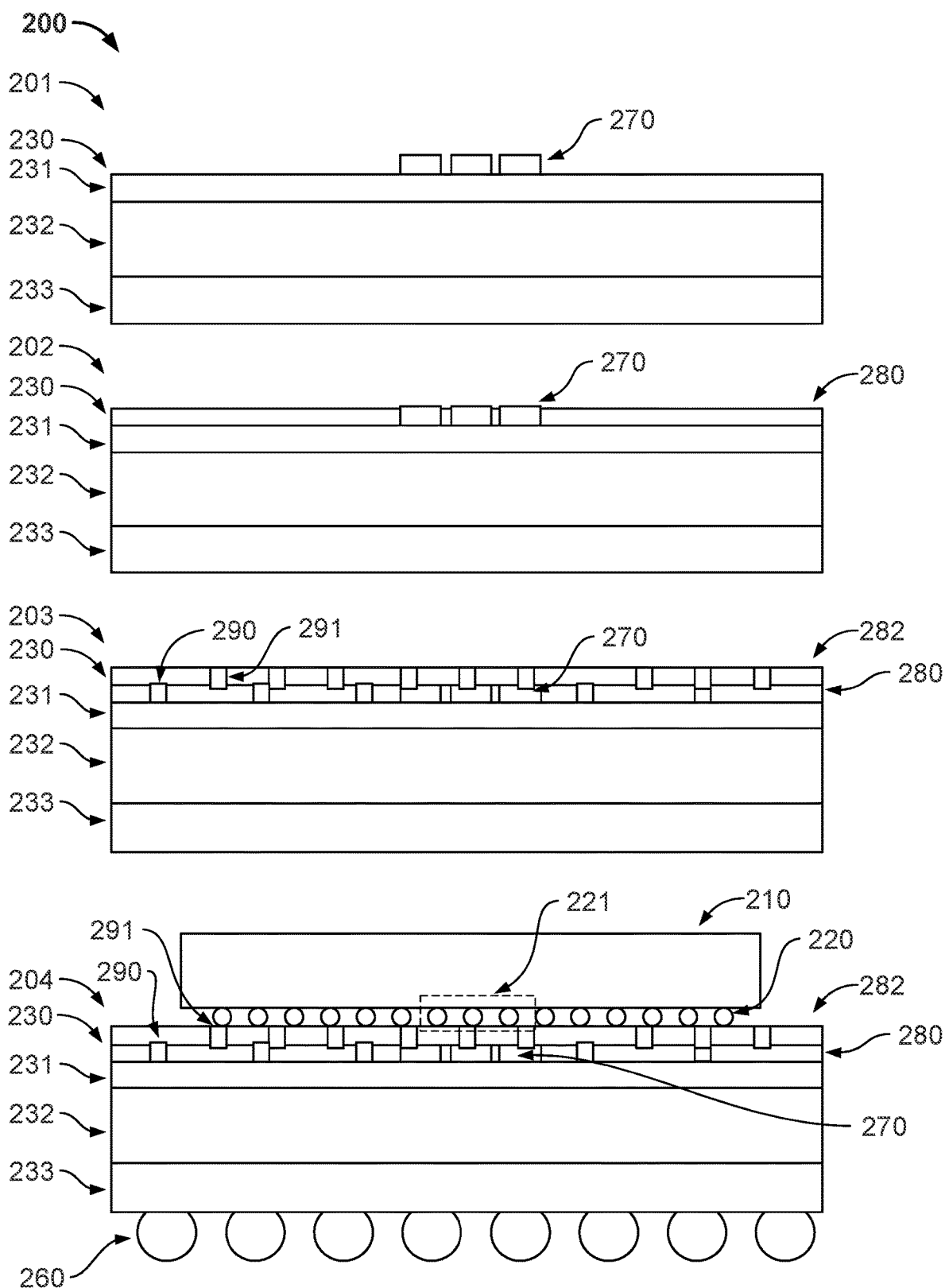
FIG. 2 is a diagram of an example process for fabricating an IC package that includes an IC and deep trench capacitors embedded in a substrate of the IC package.

FIG. 2 is a diagram illustrating an example process 200 for fabricating an IC package that includes an IC and deep trench capacitors embedded in a substrate of the IC package. The example process 200 can be performed using IC package fabrication equipment.

Deep trench capacitors 270 are mounted on a substrate 230 (201). The substrate 230 includes a substrate core 232 and substrate build-up 231 and 233 on either side of the substrate core 232. In this example, the deep trench capacitors 270 are mounted on the substrate build-up 231 on top of the substrate core 232 and on the side of the substrate 230 to which an IC will be mounted.

A first build-up layer 280 is applied to the surface of the substrate build-up 231 (202). This build-up layer 280 can be a laminate material. The build-up layer 280 can be applied to the entire surface of the substrate build-up 231, including between adjacent deep trench capacitors 270.

A second build-up layer 282 is applied over the first build-up layer 280 and vias are formed in the build-up layers 280 and 282 (203). The second build-up layer 282 can also be a laminate material. The vias, which includes vias 290 and 291, can be formed by drilling (e.g., mechanically or using a laser), away some of the laminate or other build-up material and adding conductive material to the drilled holes. These vias can be used to connect other vias of the substrate 230 (e.g., vias for routing interconnection pads of a BGA) to contact areas of an IC mounted on the substrate 230. For example, each via can include a conductive pad on the top surface of the build-up layer 282 that will be connected to a contact area of the IC, e.g., using a solder ball of the IC. In this way, the surface of the substrate 230 is configured to receive an IC.

The vias can also include vias that connect the deep trench capacitors 270 to the IC. For example, vias can be arranged over the deep trench capacitors 270 to connect contacts of the deep trench capacitors 270 to the IC.

An IC 210 is mounted on the substrate 230 (204). The IC 210 includes bumps 220, e.g., controlled collapse chip connection (C4) bumps, solder bumps, or copper bumps, that are used to mount the IC 210 to the surface of the substrate 230 formed by the second build-up layer 282. The bumps 220 include a contact area (e.g., pad) of the IC 210 and a solder or copper pillar that is used to connect the contact area to a corresponding contact area (e.g., pad) of the substrate 230. The IC 210 can be placed onto the surface of the substrate 230 such that the bumps 220 are over corresponding contact areas on the surface of the substrate 230. The bumps 220 can then be heated and cooled to form a bond between the contact areas of the IC 210 and their corresponding contact areas of the surface of the substrate 230.

Similar to the IC package 100 of FIG. 1, the IC package formed using the process 200 results in a flip chip package with deep trench capacitors 270 located under a core power distribution circuit 221 of the IC 210 to reduce the inductance path of the vias. Solder balls can also be formed on a BGA 260 on the bottom surface of the substrate 230.

Figure 3:
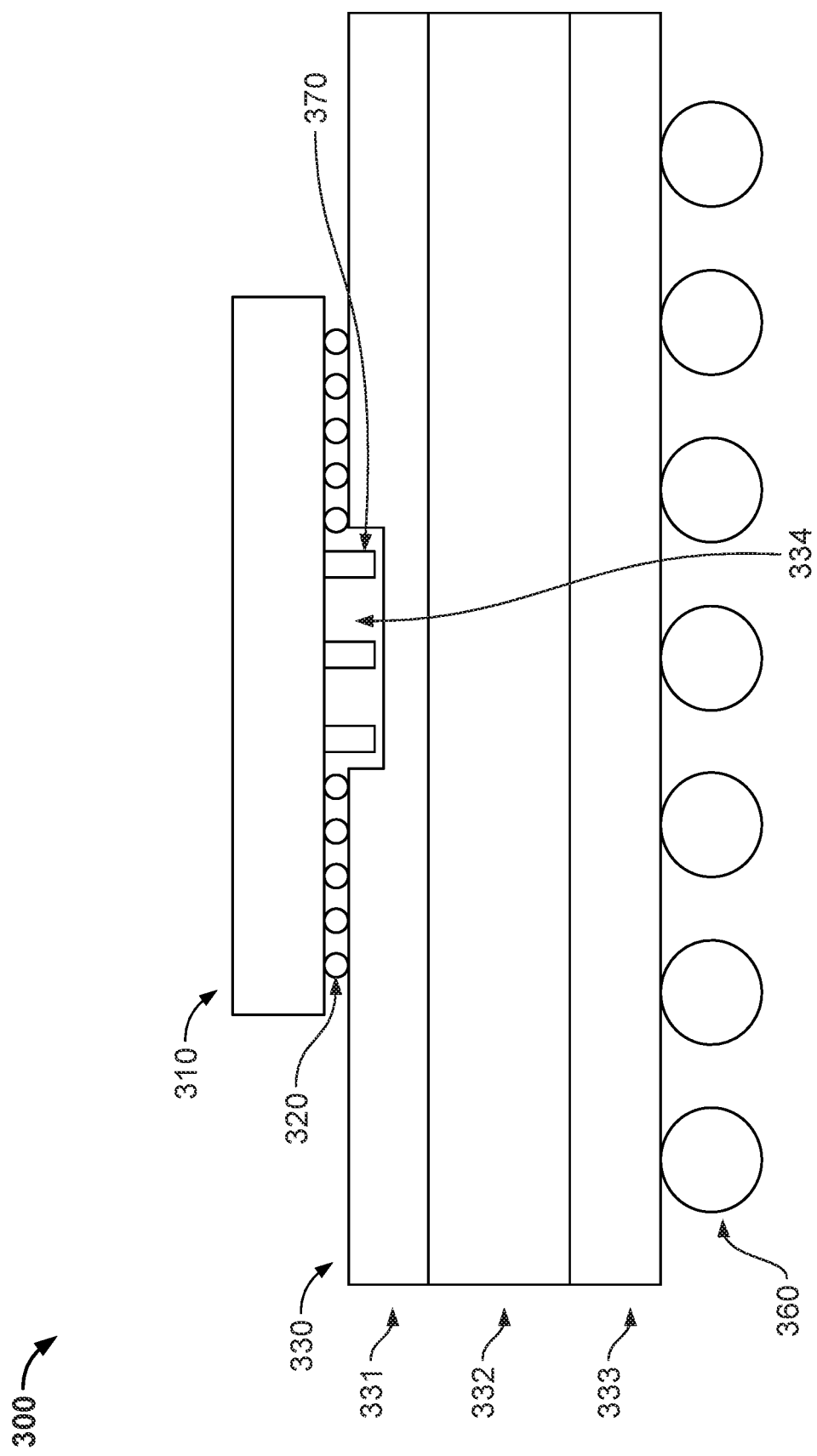
FIG. 3 is a cross-sectional view of another example IC package that includes an IC and deep trench capacitors embedded in a substrate of the IC package.

FIG. 3 is a cross-sectional view another example IC package 300 that includes an integrated circuit 310 and deep trench capacitors 370 embedded in a substrate 330 of the IC package 300. The IC package 300 includes the substrate 330, the IC 310 mounted on the substrate 330, and a BGA ball 360 that includes interconnection pads with solder balls for connecting the IC package 300 to a PCB. The IC 310 can be an ASIC or other appropriate type of IC.

In this example, the IC package 300 is a flip chip package in which solder bumps 320 are used to connect interconnection pads of the IC 310 to the substrate 330. The solder bumps 320 include a contact area (e.g., pad) of the IC 310 and a solder ball that is used to connect the contact area to a corresponding contact area (e.g., pad) of the substrate 330. Although not shown in FIG. 3, the substrate 330 can include vias that connect the contact areas of the IC 310 to the interconnection pads of the BGA ball 360.

Similar to the substrate 130 of FIG. 1, the substrate 330 includes a substrate core 332 and substrate build-up 331 and 333 on either side of the substrate core 332. One or both of the substrate build-ups 331 and 333 can be added to the substrate core 332, e.g., when fabricating the IC package 300. In some implementations, the substrate 330 includes only one or neither of the substrate build-ups 331 or 333. For example, the substrate 330 may only include a substrate build-up 331 or 333 on a side of the substrate core 332 that will include a cavity for deep trench capacitors.

The substrate 330 includes a cavity 334 for deep trench capacitors 370. The cavity 334 is formed in the substrate build-up 331 on a top side of the substrate 330. The cavity 334 can be formed by etching away some of the substrate build-up 331. In this example, the deep trench capacitors 370 are mounted on the IC 310 rather than being mounted in the cavity 334 and connected to the IC 310. Instead, the cavity 334 provides space within the substrate 330 for the deep trench capacitors 370. Thus, the cavity 334 can be sized and shaped to fit the deep trench capacitors 370 attached to the IC 310.

The deep trench capacitors 370, which can be the same as or similar to, the deep trench capacitors 170 of FIG. 1, can include contacts that are electrically connected to contact areas (e.g., pads) of the IC 310. For example, the deep trench capacitors 370 can be soldered to the IC 310 using bumps 320, e.g., C4 bumps, prior to mounting the IC 310 on the substrate 310.

Figure 4:
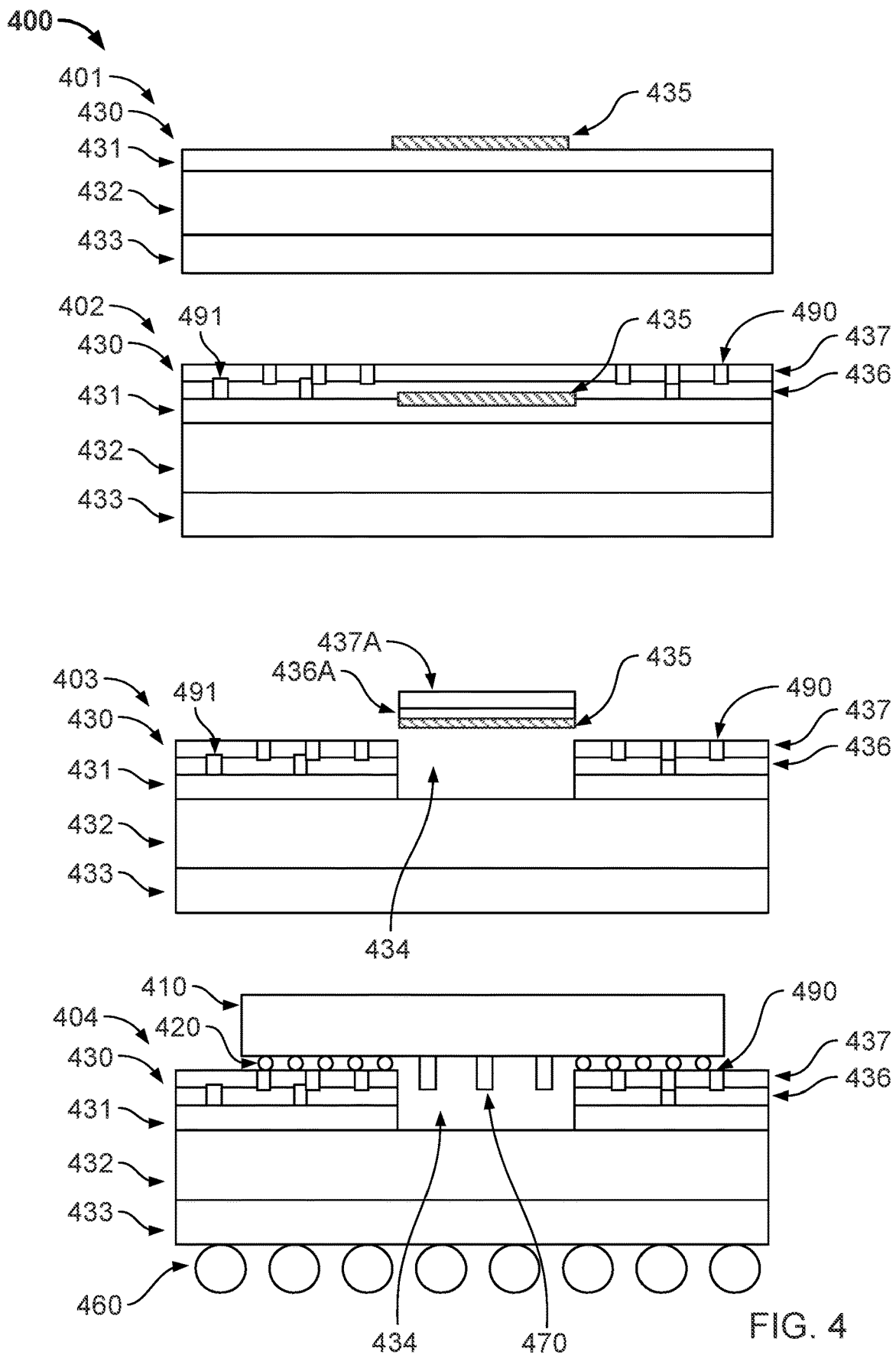
FIG. 4 is a diagram of an example process for fabricating an IC package that includes an IC and deep trench capacitors embedded in a substrate of the IC package.

FIG. 4 is a diagram of an example process 400 for fabricating an IC package that includes an IC and deep trench capacitors embedded in a substrate of the IC package. The example process 400 can be performed using IC package fabrication equipment.

A release layer 435 is applied to a substrate 430 (401). The substrate 430 includes a substrate core 432 and substrate build-up 431 and 433 on either side of the substrate core 432. The release layer 435 can be applied to the top surface of the substrate build-up 431 in each area where a cavity will be formed. In this example, a cavity will be formed in the center of the top surface of the substrate build-up 431.

The release layer 435 can be made of a less adhesive material than the other parts of the substrate 430. In this way, the release layer 435 can be easily peeled off later when removing the block from the substrate for the cavity structure.

Buildup layers 436 and 437 are applied to the surface of the substrate build-up 431 (402). These build-up layers 436 and 437 can each be a laminate material. The build-up layer 436 can be applied to the entire surface of the substrate build-up 431 and over the release layer 435. In addition, vias are formed in the build-up layers 436 and 437. The vias, which includes vias 490 and 491, can be formed by drilling (e.g., mechanically or using a laser) away some of the laminate or other build-up material and adding conductive material to the drilled holes. These vias can be used to connect other vias of the substrate 430 (e.g., vias for routing interconnection pads of a BGA) to contact areas of an IC mounted on the substrate 430. For example, each via can include a conductive pad on the top surface of the build-up layer 437 that will be connected to a contact area of the IC, e.g., using a solder ball of the IC.

A cavity 434 is formed (403). The cavity 434 can be formed by removing the release layer 435 and portions 436A and 437A of the build-up layers 436 and 437, respectively, formed over the release layer 435. For example, laser ablation can be used to remove the release layer 435 and the portions 436A and 437A of the build-up layers 436 and 437. A laser can be applied to the edges of the release layer 435 and between the edges to remove the materials. In another example, the release layer 435 and portions 436A and 437A of the build-up layers 436 and 437 can be removed using etching or another appropriate technique.

An IC 410 is mounted on the substrate 430 (404). In this example, the IC 410 includes deep trench capacitors 470 attached to the IC 410. The IC 410 can be mounted such that the deep trench capacitors 470 are disposed in the cavity 434. The cavity 434 can be formed deep enough and wide enough to house the deep trench capacitors 470. The deep trench capacitors 470 can extend into the cavity 434 and either contact or not contact a bottom surface of the cavity 434.

The IC 410 also includes bumps 420, e.g., C4 bumps, that are used to mount the IC 410 to the surface of the substrate 430 formed by the second build-up layer 437. The bumps 420 include a contact area (e.g., pad) of the IC 410 and a solder ball that is used to connect the contact area to a corresponding contact area (e.g., pad) of the substrate 430. The IC 410 can be placed onto the surface of the substrate 430 such that the bumps 420 are over corresponding contact areas on the surface of the substrate 430. The bumps 420 can then be heated and cooled to form a bond between the contact areas of the IC 410 and their corresponding contact areas of the surface of the substrate 430.

Similar to the IC package 300 of FIG. 3, the IC package formed using the process 400 results in a flip chip package with deep trench capacitors 470 attached to the IC 410 and embedded in a cavity 434 of the package substrate. Solder balls can also be formed on a BGA ball 460 on the bottom surface of the substrate 430.

FIG. 5 is a cross-sectional view of another example IC package 500 that includes an IC 510 and deep trench capacitors 570 embedded in a substrate 530 of the IC package 500. The IC package 500 is similar to the IC package 100 of FIG. 1, except that the deep trench capacitors 570 are embedded on the opposite side of the substrate. In this example, the deep trench capacitors 570 are embedded in a cavity 534 formed on the same side of the substrate 530 as the interconnection pads of a BGA ball 560. As described above, this configuration may be preferred when larger (e.g., taller) capacitors and higher capacitance is required or desired for lower bandwidth (BW) requirement.

The IC package 500 includes the substrate 530, the IC 510 mounted on the substrate 530, and the BGA ball 560 that includes interconnection pads with solder balls for connecting the IC package 500 to a PCB. The IC 510 can be an ASIC or other appropriate type of IC.

In this example, the IC package 500 is a flip chip package in which bumps 520, e.g., C4 bumps, are used to connect interconnection pads of the IC 510 to the substrate 530. The solder bumps 520 include a contact area (e.g., pad) of the IC 510 and a solder ball that is used to connect the contact area to a corresponding contact area (e.g., pad) of the substrate 530. Although not shown in FIG. 5, the substrate 530 can include vias that connect the contact areas of the IC 510 to the interconnection pads of the BGA ball 560.

Similar to the substrate 130 of FIG. 1, the substrate 530 includes a substrate core 532 and substrate build-up 531 and 533 on either side of the substrate core 532. One or both of the substrate build-ups 531 and 533 can be added to the substrate core 532, e.g., when fabricating the IC package 500. In some implementations, the substrate 530 includes only one or neither of the substrate build-ups 531 or 533. For example, the substrate 530 may only include a substrate build-up 531 or 533 on a side of the substrate core 532 that will include a cavity for deep trench capacitors.

The substrate 530 includes a cavity 534 for deep trench capacitors 570. The cavity 534 is formed in the substrate build-up 533 on a bottom side of the substrate 530. The cavity 534 can be formed by etching away some of the substrate build-up 533. The cavity 534 can be sized to fit the deep trench capacitors 570. For example, the distance the capacitors 570 can extend from the bottom surface of the substrate 530 can be limited based on the BGA ball 560 and the PCB on which the IC package 500 will be mounted. The cavity 534 can have a depth than either prevents the deep trench capacitors 570 from extending out of the cavity 534 and past the bottom surface of the substrate 530 or such that the deep trench capacitors 570 do not extend further than allowed by the BGA ball 560 and PCB requirements.

The deep trench capacitors 570 can be the same as, or similar to the deep trench capacitors 170 of FIG. 1. The substrate 530 can include vias that connect the deep trench capacitors 570 to conductive pads on the top surface of the substrate 530 that connect to the contact areas of the IC 510. To reduce the length of such vias, the cavity and the deep trench capacitors 570 can be located under (e.g., directly under) a core power distribution circuit 521 of the IC 510 that distributes power to a core or other circuits of the IC 510. In this way, the added inductance caused by the vias is reduced, resulting in less high frequency di/dt noise and less corresponding voltage loss. However, since it allows larger capacitance, it can address lower frequency di/dt noise and corresponding voltage loss.

Each of the IC packages described above can include multiple cavities, e.g., to embed more capacitors and offset more package inductance. In other cases, a single cavity can be used to embed the deep trench capacitors. Some example arrangements of cavities that can be formed in the substrates and used in the IC packages described above are illustrated in FIGS. 6-8.

FIG. 6 is a diagram of an example arrangement 600 of a cavity 630 for deep trench capacitors. In this example, the cavity 630 is located in the center of a surface of a substrate 610. The cavity 630 can be formed on the side of the substrate on which an IC is mounted or on the side of the substrate that connects to another component, e.g., to a PCB. The cavity 630 is also located directly below a core power distribution circuit area 620 (or other circuit area to be decoupled) of the IC. The cavity 630 can include one or more deep trench capacitors.

FIG. 7 is a diagram of an example arrangement 700 of cavities 730A-730C for deep trench capacitors. In this example, there are three cavities 730A-730C located near the center of a surface of a substrate 710. However, other numbers of cavities can also be used.

The cavities 730A-730C can be formed on the side of the substrate on which an IC is mounted or on the side of the substrate that connects to another component, e.g., to a PCB. The cavities 730A-730C are also located directly below a core power distribution circuit area 720 (or other circuit area to be decoupled) of the IC. Each cavity 730A-730C can include one or more deep trench capacitors.

FIG. 8 is a diagram of another example arrangement 800 of cavities for deep trench capacitors. In this example, there are six cavities 830A-830F located near the center of a surface of a substrate 810. However, other numbers of cavities can also be used.

The cavities 830A-830F can be formed on the side of the substrate on which an IC is mounted or on the side of the substrate that connects to another component, e.g., to a PCB. The cavities 830A-830C are also located directly below a core power distribution circuit area 820 (or other circuit area to be decoupled) of the IC. Each cavity 830A-830C can include one or more deep trench capacitors.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. A method for fabricating a chip package, comprising:
   forming one or more cavities in a substrate having (i) a first surface configured to receive an integrated circuit die comprising a core power distribution area located within a particular region and (ii) a second surface opposite the first surface, each cavity being formed in at least one of the first surface or the second surface;
   mounting one or more deep trench capacitors in each cavity; and
   mounting the integrated circuit die on the first surface, wherein each of the one or more cavities and each of the one or more deep trench capacitors are arranged under a core power distribution area of the integrated circuit die and within a perimeter defined by and located under the particular region of the integrated circuit die, and
   wherein the core power distribution area is a partial area of the integrated circuit die.

2. The method of claim 1, wherein:
   each cavity is formed in the first surface; and
   the method comprises applying one or more layers of substrate build-up to the first surface.

3. The method of claim 1, wherein each deep trench capacitor from the one or more deep trench capacitors is electrically connected to the integrated circuit die using vias formed in the substrate.

4. The method of claim 1, wherein forming the one or more cavities comprises etching away a portion of the substrate.

5. The method of claim 1, wherein:
each cavity is formed in the first surface;
each of the one or more deep trench capacitors is connected to the integrated circuit die prior to mounting the integrated circuit die on the first surface; and
mounting the integrated circuit die on the first surface and mounting the one or more deep trench capacitors in each cavity comprises mounting the integrated circuit die such that each deep trench capacitor from the one or more deep trench capacitors is disposed within a cavity.

6. The method of claim 1, wherein forming the one or more cavities comprises:
applying a release layer to the first surface;
applying one or more build-up layers over the release layer; and
removing the release layer and each portion of each build-up layer that covers the release layer.

7. The method of claim 6, wherein applying the release layer comprises applying the release layer to each area of the first surface where a cavity of the one or more cavities will be formed.

8. The method of claim 7, wherein forming the cavity comprises removing a first portion of the release layer and a second portion of the one or more build-up layers, wherein the second portion of the one or more build-up layers is formed onto the first portion of the release layer.

9. The method of claim 6, wherein at least one build-up layer of the one or more build-up layers comprises a laminate material.

10. The method of claim 6, further comprising forming one or more vias through openings disposed in at least one build-up layer from the one or more build-up layers, wherein a via of the one or more vias electrically couples a contact area of the integrated circuit to a top surface of the at least one build-up layer.

11. The method of claim 10, wherein the top surface of the at least one build-up layer further comprises a conductive pad.

12. The method of claim 10, wherein the via of the one or more vias electrically couples the contact area of the integrated circuit to the top surface of the at least one build-up layer using one or more solder balls of the integrated circuit.

13. The method of claim 1, wherein each of the one or more deep trench capacitors is connected in parallel with one or more circuits of the integrated circuit die.

14. The method of claim 13, wherein the one or more circuits comprise a processor core.

15. The method of claim 1, wherein the one or more deep trench capacitors comprise an oxide liner that covers a surface of the one or more cavities.

16. The method of claim 15, wherein the oxide liner of the one or more deep trench capacitors further comprises a conductive layer of material that is disposed on the oxide liner.

17. The method of claim 16, wherein the conductive layer of material disposed on the oxide liner further comprises an insulating layer of material disposed on the conductive layer of material.

18. The method of claim 1, wherein the substrate further comprises one or more substrate build-up layers and a substrate core, wherein the one or more substrate build-up layers are disposed on either side of the substrate core.

19. The method of claim 18, wherein the one or more cavities are formed in at least one of the one or more substrate build-up layers.

20. The method of claim 1, further comprising mounting the one or more deep trench capacitors into the one or more cavities using at least one of (i) a flip chip assembly, or (ii) a pick and placement assembly.

21. The method of claim 1, wherein the integrated circuit die comprises a power distribution circuit configured to control distribution of power to one or more circuits of the integrated circuit die, the method further comprising:
connecting each deep trench capacitor from the one or more deep trench capacitors to the power distribution circuit using conductors,
wherein each of the one or more cavities are formed in the first surface, and
wherein the core power distribution area of the integrated circuit die includes the power distribution circuit.

22. The method of claim 21, wherein the integrated circuit die further comprises additional circuit areas located outside the core power distribution area.

23. The method of claim 1, wherein each of the one or more cavities are formed in the first surface, the method further comprising:
forming one or more additional cavities in the second surface; and
mounting one or more additional deep trench capacitors in each additional cavity such that each additional deep trench capacitor extends from a third surface within an additional cavity of the one or more additional cavities past the second surface.

* * * * *